(12) United States Patent
Kaplar et al.

(10) Patent No.: US 11,227,844 B1
(45) Date of Patent: Jan. 18, 2022

(54) GALLIUM NITRIDE ELECTROMAGNETIC PULSE ARRESTOR

(71) Applicant: National Technology & Engineering Solutions of Sandia, LLC, Albuquerque, NM (US)

(72) Inventors: Robert Kaplar, Albuquerque, NM (US); Jack David Flicker, Albuquerque, NM (US); Olga Lavrova, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 16/589,428

(22) Filed: Oct. 1, 2019

Related U.S. Application Data

(60) Provisional application No. 62/743,287, filed on Oct. 9, 2018.

(51) Int. Cl.
| | |
|---|---|
| *H01L 23/62* | (2006.01) |
| *H01L 29/20* | (2006.01) |
| *H01L 29/861* | (2006.01) |
| *H01L 29/36* | (2006.01) |
| *H01L 29/06* | (2006.01) |

(52) U.S. Cl.
CPC .......... *H01L 23/62* (2013.01); *H01L 29/0623* (2013.01); *H01L 29/2003* (2013.01); *H01L 29/365* (2013.01); *H01L 29/8611* (2013.01)

(58) Field of Classification Search
CPC . H01L 23/62; H01L 29/0623; H01L 29/2003; H01L 29/365; H01L 29/8611
See application file for complete search history.

(56) References Cited

U.S. PATENT DOCUMENTS

| | | | | |
|---|---|---|---|---|
| 9,666,677 | B1* | 5/2017 | Raring | H01L 27/0676 |
| 2009/0289262 | A1* | 11/2009 | Zhang | H01L 29/0615 |
| | | | | 257/77 |
| 2012/0056197 | A1* | 3/2012 | Mizukami | H01L 29/872 |
| | | | | 257/77 |
| 2013/0043524 | A1* | 2/2013 | Yamagami | H01L 29/1095 |
| | | | | 257/328 |
| 2013/0105934 | A1* | 5/2013 | Matsuoka | H01L 29/8611 |
| | | | | 257/494 |
| 2013/0143392 | A1* | 6/2013 | Romano | H01L 29/475 |
| | | | | 438/478 |
| 2013/0240903 | A1* | 9/2013 | Kashyap | H02H 3/20 |
| | | | | 257/77 |
| 2014/0138705 | A1* | 5/2014 | Zhang | H01L 29/0619 |
| | | | | 257/77 |

(Continued)

OTHER PUBLICATIONS

Kaplar et al., "20 kV Gallium Nitride Electromagnetic Pulse Arrestor for Grid Reliability", presentation on Jun. 20, 2019.*

(Continued)

*Primary Examiner* — Peter Bradford
(74) *Attorney, Agent, or Firm* — Kevin W. Bieg

(57) ABSTRACT

A GaN diode EMP arrestor exhibits breakdown in <10 ns at reverse-bias voltage >20 kV. Additionally, the arrestor exhibits avalanche ruggedness at 1 kA/cm² in a 1 mm² device (i.e. 10 A absolute current) over a period of 500 ns following the onset of breakdown. Finally, the specific on-resistance in the forward direction is <20 mΩ cm².

8 Claims, 8 Drawing Sheets

(56) References Cited

U.S. PATENT DOCUMENTS

| | | | |
|---|---|---|---|
| 2015/0221804 A1* | 8/2015 | Curry | H01L 31/041 |
| | | | 257/431 |
| 2016/0372609 A1* | 12/2016 | Kiyama | H01L 29/402 |
| 2017/0271158 A1* | 9/2017 | Minamisawa | H01L 29/401 |
| 2019/0259748 A1* | 8/2019 | Naito | H01L 29/1004 |
| 2019/0287962 A1* | 9/2019 | Naito | H01L 29/0603 |
| 2021/0036511 A1* | 2/2021 | Chang | H02H 9/046 |

OTHER PUBLICATIONS

Kimoto, T. and Yonezawa, Y., "Current Status and Perspectives of Ultrahigh-Voltage SiC Power Devices", Materials Science in Semiconductor Processing, 2018, vol. 78, pp. 43-56.

Armstrong, A.M. et al., "High Voltage and High Current Density Vertical GaN Power Diodes," Electronics Letters, 2016, vol. 52, pp. 1170-1171.

Aktas, O. and Kizilyalli, I.C. "Avalanche Capability of Vertical GaN p-n Junctions on Bulk GaN Substrates," IEEE Electron Device Letters, 2015, vol. 36, pp. 890-892.

Mauch, D.L. et al., "Ultrafast Reverse Recovery Time Measurements for Wide-Bandgap Diodes," IEEE Transactions an Power Electronics, 2017, vol. 32, pp. 9333-9341.

Ohta, H. et al., "5.0 kV Breakdown-Voltage Vertical GaN p-n Junction Diodes," Japanese Journal of Applied Physics, 2018, 04FG09, vol. 57, pp. 04FG09-1-04FG09-4.

Vanbrunt, E. et al., "27 kV, 20 A 4H-SiC n-IGBTs," Materials Science Forum, 2015, vols. 821-823, pp. 847-850.

Ohta, H. et al., "Vertical GaN p-n Junction Diodes with High Breakdown Voltages over 4 kV," IEEE Electron Device Letters, 2015, vol. 36, pp. 1180-1182.

King, M.P. et al., "Identification of the Primary Compensating Defect Level Responsible for Determining Blocking Voltage of Vertical GaN Power Diodes," Applied Physics Letters, 2016, vol. 109, p. 183503-1-183503-5.

Dickerson, J. R. et al., "Vertical GaN Power Diodes With a Bilayer Edge Termination," IEEE Transactions on Electron Devices, 2016, vol. 63, pp. 419-425.

Collins, K. C. et al., "Imaging the Impact of Proton Irradiation on Edge Terminations in Vertical GaN PIN Diodes," IEEE Electron Device Letters, 2017, vol. 38, pp. 945-948.

Niwa, H. et al., "21.7 kV 4H-SiC PiN Diode with a Space-Modulated Junction Termination Extension", Applied Physics Express, 2012, vol. 5, p. 064001-1-064001-3.

Kizilyalli, I.C. et al., "Reliability Studies of Vertical GaN Devices Based on Bulk GaN Substrates," Microelectronics Reliability, 2015, vol. 55, pp. 1654-1661.

\* cited by examiner though only the much slower E3 component (>1 s) is covered.

GALLIUM NITRIDE ELECTROMAGNETIC PULSE ARRESTOR

CROSS-REFERENCE TO RELATED APPLICATION

This application claims the benefit of U.S. Provisional Application No. 62/743,287, filed Oct. 9, 2018, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to electric grid protection and, in particular, to a gallium nitride electromagnetic pulse arrestor that can protect the electric grid against fast-transient over-voltage electromagnetic pulses.

BACKGROUND OF THE INVENTION

Threats to the United States' electric grid are urgent national security concerns. The threats with perhaps the greatest potential consequences are electromagnetic pulses (EMPs) produced by high-altitude nuclear explosions and/or low-frequency geo-magnetic disturbances due to large solar storms. See J. S. Foster Jr. et al., "Report of the Commission to Assess the Threat to the United States from Electromagnetic Pulse (EMP) Attack: Critical National Infrastructures," *Defense Technical Information Center* (2008). Either could cause blackouts and severe grid damage over an extremely large area. A possible scenario involving the fast component of an EMP, termed E1, may require 4-10 years for full grid restoration. See D. N. Baker et al., "Workshop Report: Severe Space Weather Events—Understanding Societal and Economic Impacts," *The National Academies Press* (2009). Since all other critical infrastructure, including water, food, transportation, communications, finance, etc. depends on the electric grid, even short-term events are likely to incur significant costs. For example, the largest blackout in North American history, the Northeast Blackout of 2003, caused 50 million people to be without power for 2 days, resulted in 11 deaths, and cost an estimated $6B. See J. R. Minkel, "The 2003 Northeast Blackout—Five Years Later," *Scientific American* (Aug. 13, 2008). An enduring blackout due to an EMP event would likely be significantly more catastrophic, both in terms of human lives lost and dollars spent to restore the grid. Despite the potential consequences, little attention has been paid to making the grid resilient against EMP threats. Significant resilience will require investments in new materials and devices to strategically upgrade the most critical and sensitive infrastructure nodes in the grid.

Today's electric grid has both passive and active protection schemes designed to enhance grid resiliency against a variety of operational failure modes. Today's grid protection capabilities include very slow over-current protection devices (e.g. circuit breakers) as well as over-voltage protection devices (e.g. lightning arrestors). However, these protection schemes are insufficient to harden the grid against the unique fast-transient over-voltage conditions brought on by the E1 component (<1 μs) of an EMP. While the Federal Energy Regulatory Commission (FERC) has mandated that operators integrate EMP protection into new upgrades to the grid, only the much slower E3 component (>1 s) is covered. See R. Binder and M. Vlissides, "Reliability Standard for Transmission System Planned Performance for Geomagnetic Disturbance Events," *Federal Energy Regulatory Commission Final Rule,* 18 CFR Part 40 (2016). This is partly because conventional protection devices cannot respond on the timescale of E1, or in many cases even on the timescale of the intermediate E2 range (between 1 μs and 1 s).

While a step in the right direction, FERC's mandate falls far short of hardening the grid to the full suite of E1, E2, and E3 over-voltage and over-current transients that would result from an EMP event. To fully protect the grid, solutions are needed that can protect against E1/E2 over-voltages on much shorter time scales than do conventional protection schemes. As shown in FIG. 1, the fastest protection devices present on the grid today are lightning surge arrestors (LSAs) that are typically based on randomly-oriented zinc oxide domains. LSAs are designed to respond to lightning-induced over-voltage events on the order of 10 μs, which is ~1000× longer than the fast-transient onset of an EMP. Thus, LSAs are insufficient to protect the grid against the fast-transient over-voltage conditions brought on by an EMP (<10 ns).

SUMMARY OF THE INVENTION

The present invention is directed to a high-voltage gallium nitride (GaN) PN diode pulse arrestor that could protect the nation's electric grid against EMP threats. The electromagnetic pulse arrestor comprises a high-doped n-type gallium nitride substrate or contact layer; a low-doped n-type gallium nitride drift layer epitaxially grown on the gallium nitride substrate; a high-doped p-type gallium nitride layer epitaxially grown on the drift layer, thereby forming a p-n junction with the drift layer; an ohmic cathode contact to the high-doped n-type gallium nitride substrate or contact layer; an ohmic anode contact to the epitaxial high-doped p-type gallium nitride layer; and an edge termination structure laterally surrounding the p-n junction on the drift layer. The invention uses the epitaxial growth of thick 100 μm), low-doped ($<2\times10^{15}$ cm$^{-3}$) drift layers to block high voltage, and advanced edge termination structures to prevent premature breakdown. The electromagnetic pulse arrestor can have a response time of less than 10 ns and an avalanche breakdown voltage of greater than 20 kV in reverse bias. Additionally, the high-voltage GaN diode can provide a fundamental building block for the creation of more complex high-voltage vertical GaN devices, such as MOSFETs, which can have wide-ranging impact on the grid and other applications.

BRIEF DESCRIPTION OF THE DRAWINGS

The detailed description will refer to the following drawings, wherein like elements are referred to by like numbers.

FIG. 5A shows a floating field ring (FFR) edge termination. FIG. 5B shows a 2-zone junction termination extension (JTE) edge termination. FIG. 5C shows a 3-zone JTE edge termination. FIG. 5D shows a space-modulated JTE edge termination. FIG. 5E shows an improved space-modulated JTE edge termination. See T. Kimoto and Y. Yonezawa, "Current Status and Perspectives of Ultrahigh-Voltage SiC Power Devices", *Mat. Sci. in Semicon. Proc.* 78, 43 (2018).

DETAILED DESCRIPTION OF THE INVENTION

The present invention is directed to an EMP arrestor based on gallium nitride (GaN) that is fundamentally different than an LSA and that can protect against fast E1 and E2 transients. The GaN-based EMP arrestor exhibits high-voltage operation (>20 kV) and very fast response time (<10 ns). The 20-kV operation provides adequate margin to protect distribution-level equipment (up to 13 kV) with a single device while simultaneously providing a building block to protect sub-transmission equipment (up to 69 kV) with a small number of stacked devices. The arrestor can be situated in parallel with the grid equipment to be protected, clamping the voltage experienced by the equipment at the arrestor's breakdown voltage while simultaneously shunting current to ground. The GaN devices can provide better performance uniformity than today's state-of-the-art LSAs, since they are not composed of aggregates of randomly-oriented particulate domains as are LSAs. Rather, the EMP arrestor of the present invention is a high-voltage PN junction diode that goes into controlled avalanche breakdown to clamp the voltage across it at a designed breakdown voltage (VB).

Figure 1:
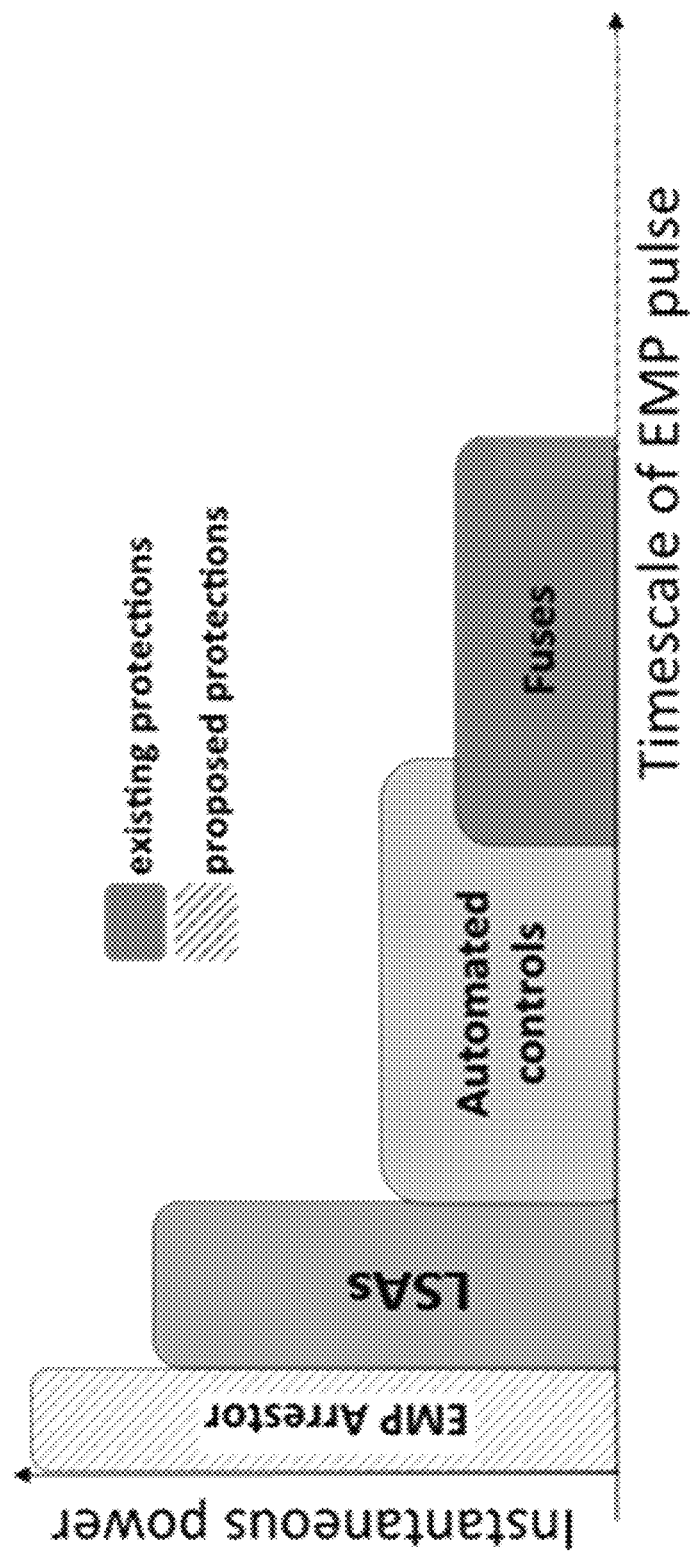
FIG. 1 is a graph of instantaneous power versus timescale of EMP pulse for various grid protection techniques. Conventional grid protection techniques are only effective at time scales longer than typical EMP transients.
Figure 2:
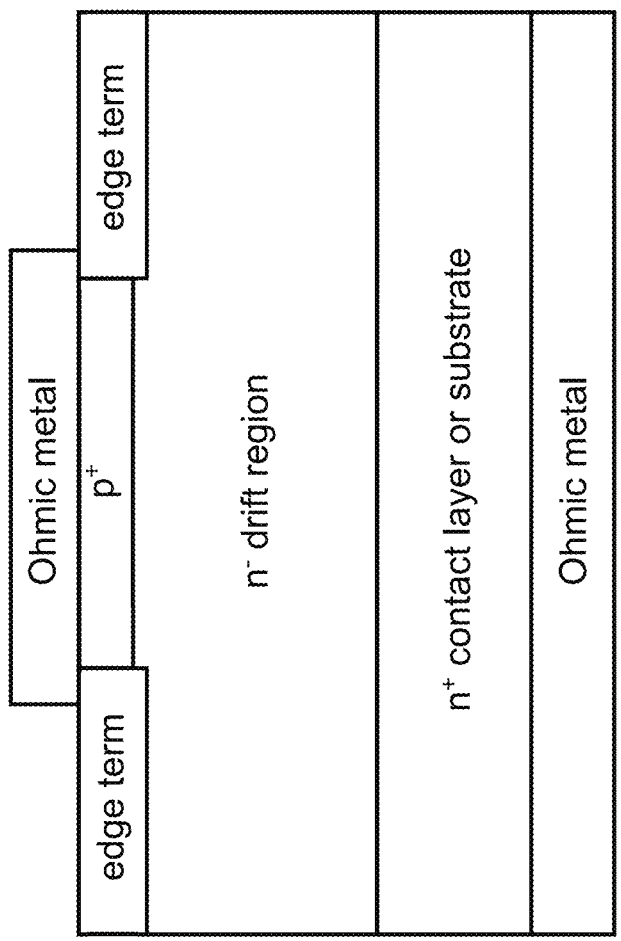
FIG. 2 is a cross-sectional schematic illustration of a GaN PN junction diode that can be used as an EMP arrestor.

A schematic cross-sectional illustration a diode is shown in FIG. 2. An exemplary diode comprises a greater than 100-μm thick low-doped n-type GaN voltage-blocking drift layer epitaxially grown on a highly doped (e.g., a few orders of magnitude higher than the drift layer doping) n-GaN substrate or contact layer.

The n-type GaN drift layer can be doped with a donor (e.g. Si) and have an electron concentration of less than about $2 \times 10^{15}$ cm$^{-3}$. Next, a thin p$^+$-GaN layer, doped with an acceptor (e.g. Mg) concentration of >$10^{19}$ cm$^{-3}$ is grown. The p$^+$-GaN layer must be much thinner than the n-type GaN drift layer (e.g., less than about 400 nm). The p$^+$-GaN/n$^-$-GaN layers form the main junction of the vertical p-n diode. Next, edge termination structures are formed outside of the main p-n junction. Finally, ohmic metal contacts are deposited on the top of the high-doped p$^+$-GaN layer, to form the anode contact (e.g. Pd/Au), and the exposed bottom side of the n-GaN substrate, to form the cathode contact (e.g. a Ti/Al/Ti/Ni/Au metal stack).

During forward-bias operation, charge carriers are injected from the highly doped p- and n-layers (i.e., anode and cathode). Conversely, under increased reverse bias, the depletion region and electric field increase inside the diode. Because of the low doping in the drift layer, most of the potential will drop across the drift layer in the region of the main junction. The variation in dopant concentration in the edge termination structure enables the depletion region to penetrate the edge termination layer and spread the electric field, thereby reducing the peak electric field to avoid premature avalanche breakdown under reverse bias. Avalanche breakdown will occur at a critical electric field due to runaway impact ionization from highly energetic electrons and holes. Under reverse bias, the avalanche breakdown voltage can typically be on order 20 kV.

Figure 3:
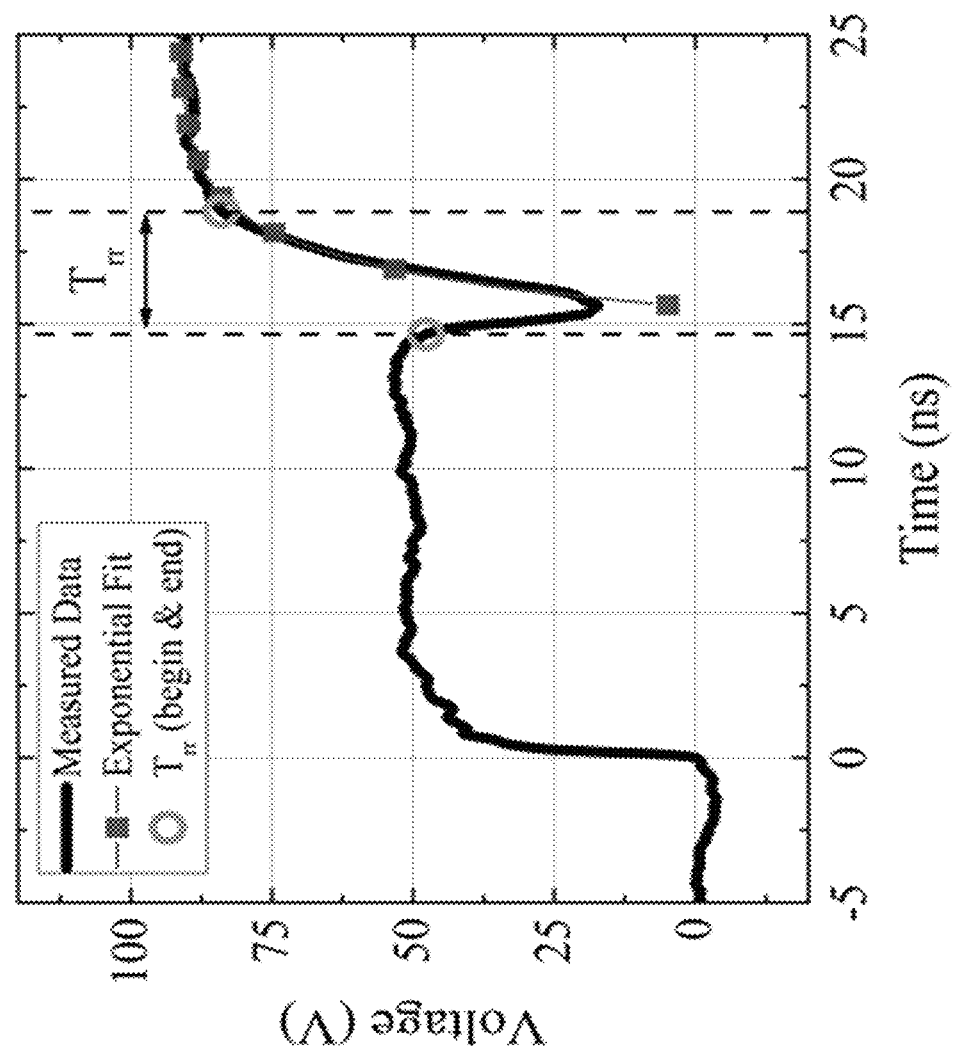
FIG. 3 is a graph of the measured reverse-recovery waveform for a GaN PN diode, showing temporal response on the order of ns. See D. L. Mauch et al., "Ultrafast Reverse Recovery Time Measurements for Wide-Bandgap Diodes," *IEEE Trans. Elec. Dev.* 32 (12), 9333 (2017).

The diode exhibits not only 20 kV blocking capability but also avalanche ruggedness, i.e., it can sustain high current density (>1 kA/cm$^2$) at the breakdown voltage for the duration of the EMP insult (which may be longer than the onset response time). Given GaN's high critical electric field (Ec~4 MV/cm), very fast response time (ns range), and demonstrated avalanche ruggedness, it is an ideal material for the arrestor. See A. M. Armstrong et al., "High Voltage and High Current Density Vertical GaN Power Diodes," *Elec. Lett.* 52 (13), 1170 (2016); and O. Aktas and I. C. Kizilyalli, "Avalanche Capability of Vertical GaN p-n Junctions on Bulk GaN Substrates," *IEEE Elec. Dev. Lett.* 36 (9), 890 (2015). A measured reverse-recovery transient for a GaN PN diode is shown in FIG. 3, demonstrating ns-scale time response. See D. L. Mauch et al., "Ultrafast Reverse Recovery Time Measurements for Wide-Bandgap Diodes," *IEEE Trans. Elec. Dev.* 32 (12), 9333 (2017). While the trace shown is for reverse-recovery and not avalanche breakdown, the breakdown time is similarly short. The highest breakdown voltage previously demonstrated for a GaN diode is 5.0 kV, so to achieve 20 kV the invention uses advancements in materials growth (primarily thick, low-doped epilayers) and device processing (primarily edge termination). See H. Ohta et al., "5.0 kV Breakdown Voltage Vertical GaN pn Junction Devices," *Jap. J. Appl. Phys.* 57, 04FG09 (2018).

Further, while power devices based on the semiconductor silicon carbide (SiC) have been demonstrated to 27 kV, typical carrier lifetimes in SiC are on the order of 1-10 μs, suggesting that the response time of SiC may not be fast enough to handle E1 transients. See E. van Brunt et al., "27 kV, 20 A 4H—SiC n-IGBTs," *Mat. Sci Forum* 821-823, 847 (2015). Therefore, GaN has a distinct advantage in terms of response time. GaN can also be superior to the competing SiC device technology in significantly reduced chip area and related lower cost. The unipolar figure-of-merit (FOM) dictates that chip area scales as $1/E_c^3$ for equivalent breakdown voltage and on-resistance, where Ec is the critical electric field of the semiconductor, and other material properties such as mobility and permittivity are equivalent between materials. Given that GaN's critical electric field is roughly twice that of SiC (~4 MV/cm compared to ~2 MV/cm), approximately an 8× reduction in chip area can thus be obtained by using GaN compared to SiC. If cost scales directly with chip area, in high-volume manufacturing a GaN-based vertical device could therefore potentially have an 8×, or nearly an order of magnitude, reduction in cost relative to SiC. However, GaN substrates are at present significantly more expensive than SiC substrates, and vertical GaN processing costs are likewise far higher than those of SiC, so that the relative costs of the two technologies do not scale solely with chip area. However, the cost of vertical GaN can be reduced by increasing the production volume and accelerating adoption by establishing a commercially-viable foundry capability, thereby eventually enabling the nearly order-of-magnitude cost reduction of vertical GaN compared to SiC based on chip-area scaling to be realized.

Gallium Nitride Substrates

Properties of the GaN substrate (e.g. miscut, polish, low-angle grain boundaries) can greatly impact the evolution of tensile strain and surface morphology in the grown epitaxial layer. High-quality epitaxial growth of the overgrown layers requires not only a GaN substrate with a highly-ordered crystalline bulk structure, but also one where the high crystalline order continues to the surface. Poorly-developed polish processes can result in surface or subsurface damage to the crystal, which will generate crystalline imperfections in the overgrown epitaxial layer even if the bulk crystal were perfect.

Commercially available GaN substrates grown by hydride vapor-phase epitaxy (HVPE) or ammonothermal bulk growth can be used. While HVPE-grown substrates are larger, less expensive, and widely available, they are not truly single-crystal, but rather are a collection of single-crystal domains that are slightly tilted or rotated relative to the adjacent domains. The combination of low-angle grain boundaries and domain misalignment results in local variations in the miscut of the surface that impact impurity incorporation, formation of compensating defects, and strain in the epitaxial drift layer. While ammonothermally-grown GaN substrates exhibit lower threading dislocations and are of higher crystalline quality than HVPE substrates, they are more expensive, typically smaller diameter, and are offered by few vendors. Proprietary polishing processes, along with the initial nucleation step, greatly affect the resulting surface morphology and strain of the epitaxial layer. Surface morphology and crystal quality can be optimized by conducting growth studies employing substrates from both growth methods, along with a systematic study of surface miscut angle. Additionally, in-situ thermal and chemical etching can be used to remove polish-induced sub-surface damage and Si surface contamination, to improve surface morphology and provide a more-ordered crystalline surface for epitaxy.

Epitaxial Growth

High-quality thick films (>100 μm) on bulk GaN substrates can be achieved via epitaxial growth using metal-organic chemical vapor deposition (MOCVD). These GaN epitaxial films are >2× thicker than what has been previously grown by MOCVD. See H. Ohta et al., "5.0 kV Breakdown Voltage Vertical GaN pn Junction Devices," *Jap. J. Appl. Phys.* 57, 04FG09 (2018); and H. Ohta et al., "Vertical GaN pn Junction Diodes with High Breakdown voltage over 4 kV," *IEEE Elec. Dev. Lett.* 36 (11), 1180 (2015). Thick epitaxial films are enabled by using GaN growth substrates, control of compensating defects, strain, and process stability during growth of >100-μm-thick drift layers.

Figure 4:
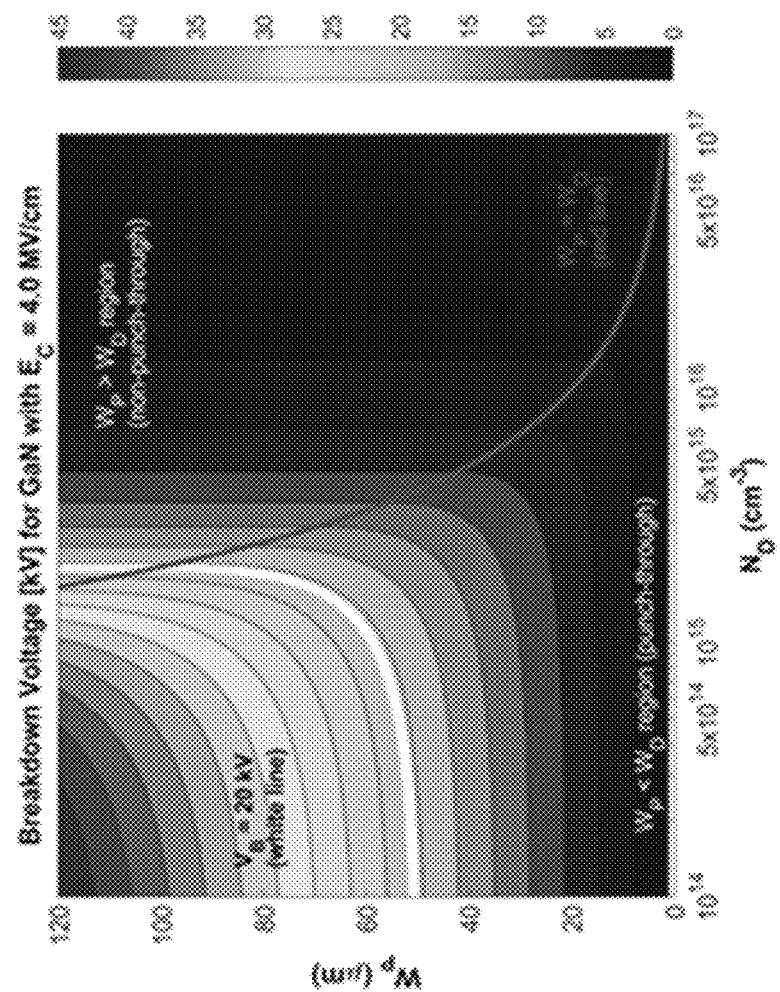
FIG. 4 is a contour plot showing expected breakdown voltage for a one-dimensional GaN planar junction as a function of drift layer thickness and doping. The white line shows the 20-kV breakdown contour.

For the 20 kV PN diodes, the thick drift layer must have controllable, consistent carrier density $2\times10^{15}$ cm$^{-3}$, as shown in FIG. 4. While growth conditions are optimized that minimize dopant compensation (e.g. temperature, group-III flux, NH3 partial pressure, etc.), the drift layer can be grown under conditions known as "compensation doping". Under such conditions, the density of compensating defects and impurities (e.g. $8\times10^{15}$ cm$^{-3}$) is higher than the desired carrier concentration of $2\times10^{15}$ cm$^{-3}$. A slightly higher density of intentional dopants (e.g. $1\times10^{16}$ cm$^{-3}$) can be incorporated to achieve total carrier density in the low $10^{15}$ cm$^{-3}$ range. By actively stabilizing the growth process by adjusting for process drift (e.g. temperature) during the growth of the thick drift layer, thereby stabilizing the compensating defect/impurity concentrations, a much wider range of growth conditions can be accessed than those that singularly minimize incorporation of compensating defects. This provides important flexibility because conditions that might lower the density of compensating defects below the target carrier concentration often present undesirable restrictions, such as low growth rates. Throughout the growth, stable and precise control of drift layer doping is necessary to avoid build-up of tensile strain and maintain a high-quality surface to achieve very thick layers. Therefore, by actively controlling the growth process, growth conditions and higher growth rates can be achieved that mitigate the development of excessive tensile strain and maintain planar surface morphology. Growth reactors can be equipped with in-situ reflectance and curvature measurement tools to provide real-time monitoring for surface degradation as well as wafer bowing due to tensile strain that can lead to non-uniform growth temperature across the wafer, which would change carrier compensation and carbon incorporation.

Epitaxial Layer Characterization

The characterization of the thick epitaxial layers is essential to understand the relationships between material characteristics and device performance. The characterization approaches can include:
  Crystallinity of the thick GaN epitaxial layers can be evaluated using wafer-level X-ray diffraction (XRD), photoluminescence (PL), and Raman spectroscopy mapping.
  Carrier concentration and uniformity can be characterized directly on non-patterned wafers by capacitance-voltage (CV) profiling. Additionally, temperature-dependent Hall-effect measurements of doping density, mobility, and resistivity can be performed, and direct CV measurements on fabricated test structures can be used to corroborate these results.
  Surface morphology and roughness can be mapped at the wafer-level using non-contact optical techniques, such as white-light interferometry and Nomarski imaging. The surface morphology can be spot-checked at specific locations via atomic force microscopy (AFM).
  Cross-polarizer (XPOL) imaging can be used to evaluate strain inhomogeneity and gradients across the wafer.
  Wafer shape before and after epitaxy can be characterized with a wafer curvature evaluation tool.
This information can be correlated with measured device performance maps of on-resistance, blocking voltage, switching performance, reliability, etc. Additionally, the defectivity and doping/carrier concentrations in films can be evaluated as a function of epitaxial layer thickness to determine if additional point or extended defects are being generated as epi-layer thickness increases.

Deep-Level Characterization

Beyond these characterization techniques, a suite of deep-level defect spectroscopies can be used to monitor, control, and understand the impact of impurities and point defects on the high-voltage GaN PN diodes. These techniques are particularly important for ultra-high breakdown voltage devices because the background concentration of compensating defects puts a lower limit on the controllable doping level and hence an upper limit on VB. Also, defects that form electronic states near the middle of the bandgap can cause premature breakdown by enabling inter-band tunneling at high electric field. Spin-resonance techniques, such as electron-spin resonance (ESR) and optically-detected magnetic resonance (ODMR), can be employed to evaluate select samples to obtain further information about the nature of the defect centers and types of dopants involved in transport. Further, deep-level defects in high-voltage GaN diodes can be examined using deep-level optical spectroscopy (DLOS) and lighted capacitance-voltage (LCV) as a function of growth conditions and starting substrate. See M. P. King et al., "Identification of the Primary Compensating Defect Level Responsible for Determining Blocking Voltage of Vertical GaN Power Diodes," *Appl. Phys. Lett.* 109, 183503 (2016). DLOS can be used to quantify both the concentrations and energy levels of defect states in thick GaN films, thus providing a way to optimize growth conditions and substrate choice to maximize VB.

Measurement of GaN Impact Ionization Coefficients

Impact ionization is the physical process by which free carriers in a region with high electric field gain enough energy to collide with lattice atoms and create electron-hole pairs. Therefore, impact ionization coefficients, that measure the number of electron-hole pairs created due to the local electric field, are critically important parameters that determine the breakdown characteristics of a semiconductor. Unfortunately, the impact ionization coefficients of GaN are not well-established. The electron and hole impact ionization coefficients in GaN can be extracted using $p^+/n^-/n^+$ diode structures. The impact ionization coefficients can be extracted from measurements of the multiplication factor in the $p^+/n^-/n^+$ structures utilized as avalanche photodetectors. The electron and hole coefficients must be measured separately. To measure the electron (hole) coefficients, UV light can be used to illuminate the top (bottom) side of the structure, which will generate electron-hole pairs. The electrons (holes) will be swept into the depleted $n^-$ region, causing carrier multiplication from which the electron (hole) impact ionization coefficient can be extracted. The resulting coefficients can be implemented in TCAD modeling to accurately simulate diode breakdown voltage.

Edge Termination Structure

Figure 5A:
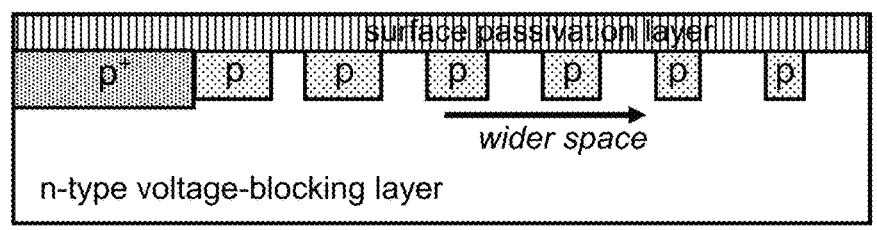
FIGS. 5A-5E are examples of edge termination approaches.
Figure 5B:
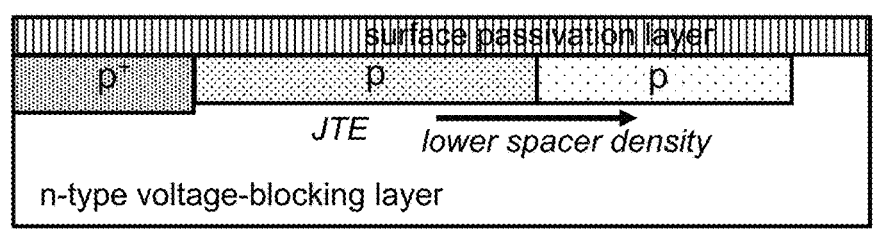
Figure 5C:
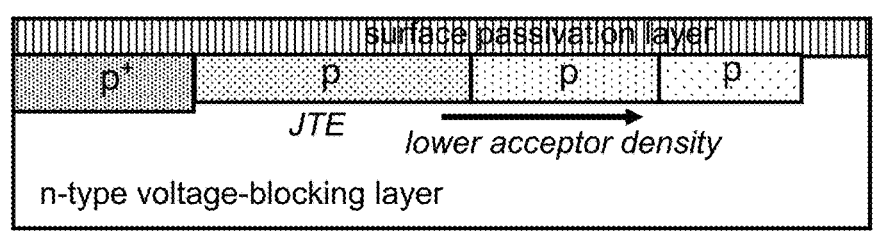
Figure 5D:
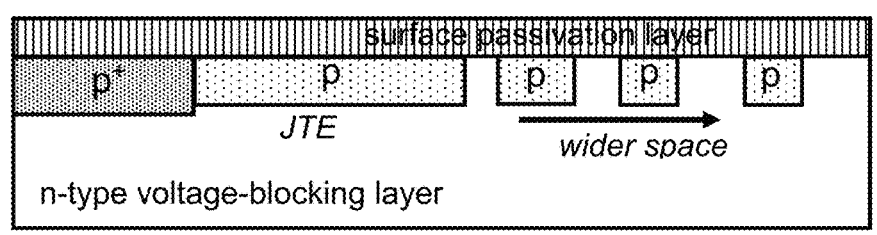
Figure 5E:
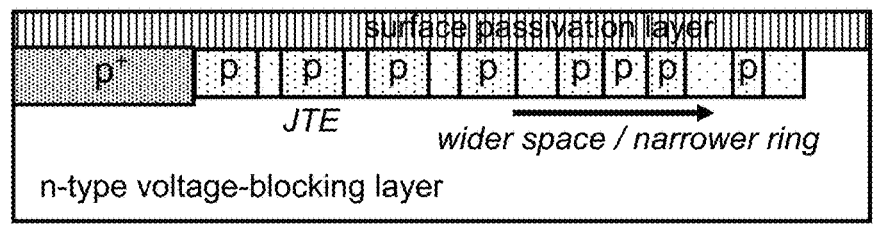

Achieving a 20-kV breakdown voltage requires electric field management and device passivation. Electric field edge terminations that mitigate the localization of electric fields are critical to achieving uniform avalanche breakdown beneath the active area, thereby avoiding premature breakdown due to impact ionization and avalanche breakdown. The principal edge termination types are concentric floating field rings (FFR) or guard rings, as shown in FIG. 5A, and the junction termination extension (JTE), as shown in FIGS. 5B-5E. See J. R. Dickerson et al., "Vertical GaN Power Diodes with a Bilayer Edge Termination," *IEEE Trans. Elec. Dev.* 63 (1), 419 (2016); and K. C. Collins et al., "Imaging the Impact of Proton Irradiation on Edge Terminations in Vertical GaN PIN Diodes," *IEEE Elec. Dev. Lett.* 38 (7), 945 (2017). Various permutations of JTE edge terminations exist, including multi-zone JTEs, as shown in FIGS. 5B and 5C, space-modulated JTEs, achieved via implantation, as shown in FIGS. 5D and 5E, or step-etching into the p-layer, and multiple-floating-zone JTE. See T. Kimoto and Y. Yonezawa, "Current Status and Perspectives of Ultrahigh-Voltage SiC Power Devices", Mat. Sci. in Semicon. Proc. 78, 43 (2018); and T. Kimoto and J. A. Cooper, Fundamentals of Silicon Carbide Technology (John Wiley & Sons, Singapore, 2014), pp. 427-434.

FFRs are attractive because the blocking capability is not significantly dependent on the implant dose of the guard rings; however, the electric field is not reduced, but only spreads out. The JTE, on the other hand, reduces the electric field while also spreading the field. A single zone JTE comprises a lower doped layer that is located on the edges of and laterally surrounds the main junction's top $p^+$-GaN layer, as shown in FIG. 5B. The doping of the edge termination can be optimized between the high-doped $p^+$-GaN layer and the low-doped drift layer. The lower dopant concentrations in the edge termination structure enables both the depletion region to penetrate the edge termination layer and spread the electric field from the main junction region, thereby reducing the peak electric field to avoid premature avalanche breakdown under reverse bias. Specifically, the additional charge due to ionized acceptors within the JTE acts to spread the peak electric field away from the edges of the main junction by creating a second peak electric field on the outside edge of the JTE, lowering the number of impact ionization events and increasing the breakdown voltage. However, the effectiveness of the single-zone JTE is strongly dependent on the active p-type dose. Among the advanced designs, the space-modulated JTE has been effective in achieving 22 kV breakdown voltages in SiC PN diodes, and SiC IGBTs have achieved 27 kV breakdown voltage employing FFRs. See H. Niwa et al., "21.7 kV 4H—SiC PiN diode with a Space-Modulated Junction Termination Extension", *Appl. Phys. Exp.* 5, 064001 (2012); and I. C. Kizilyalli et al., "Reliability Studies of Vertical GaN Devices Based on Bulk GaN Substrates," *Microelec. Rel.* 55, 1654 (2015).

Figures 6A, 6B:
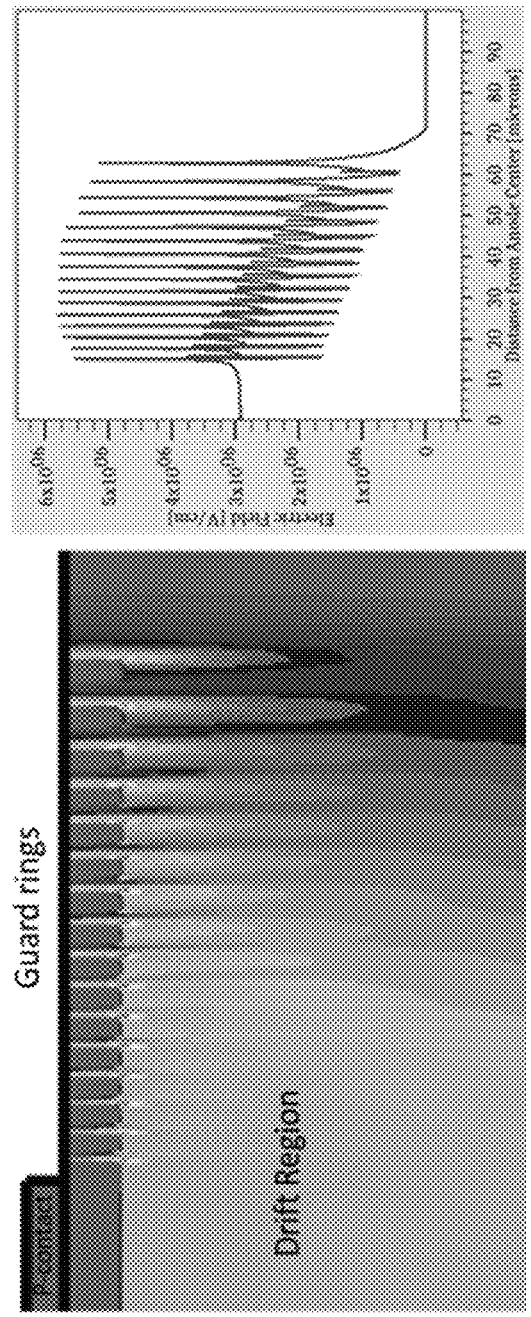
FIG. 6A is a Technology Computer Aided Design (TCAD) simulation of the cross-sectional electric field distribution in a vertical GaN diode employing guard ring field termination, where colors indicate magnitude of electric field.
FIG. 6B is a graph of electric field magnitude vs. distance from anode center.

TCAD simulations can be used to model the field termination approaches and optimize the design for maximum breakdown voltage. For example, guard-ring designs for 20 kV operation can include as many as 50 concentric rings, and simulations can identify optimal ring spacings as a function of drift layer doping and desired blocking voltage. An example of a TCAD simulation of guard-ring termination in a GaN PiN diode is shown in FIG. 6A. FIG. 6B is a graph of electric field magnitude vs. distance from anode center. Several additional factors must be considered to achieve the optimal designs. Some designs require submicron-wide features, which puts strong demands on device process tolerances. Pattern definition, by either ion-implantation or etching, must be carefully controlled to enable a reproducible device process. Surface charge effects can also be important, particularly in JTE terminations, and can be alleviated by forming a buried termination that is isolated from the surface. With a properly designed edge termination, 80-90% of the planar breakdown can be achieved in a real device. The growth process can be reproducibly controlled within the tolerance values necessary to maximize the performance of the edge termination structures. For example, FFR edge terminations containing large numbers of rings may require small spacing that could challenge contact lithography techniques. To aid in the control of the fabrication processes in question, process monitoring features and laser reflectometry can be employed. Both wafer shape (warp, bow) and surface roughness can be monitored to make sure the values remain within the tolerances of the photolithography tools.

Failure Analysis and Reliability Evaluation

Understanding the root causes of failures and device degradation is essential for component reliability and voltage scaling. A wafer-level high-voltage (20 kV) auto-prober, housed in a vacuum chamber to avoid surface flashover, can be equipped with electroluminescence (EL) imaging capability to provide highly accurate spatial detection of breakdown events. The spectroscopic EL capability of the high-voltage vacuum prober uses an extremely sensitive thermoelectric-cooled CCD imager that is very useful for detecting active failure points and even "pre-failure" locations, i.e. regions that will eventually fail in devices subjected to high temperature and high reverse-bias voltage (known as HTRB conditions). The concentration of the electric field at defects produces micro-plasmas that can be detected and later identified with microscopy and spectroscopic techniques such as micro-Raman and micro-PL. By identifying specific locations of failures using the EL technique, focused ion beam (FIB) profiling can be performed and sections can be analyzed by transmission electron microscopy (TEM). The spectroscopic information in the EL images (200-1000 nm resolution range) can also generate signatures of defects that can be correlated to specific failure modes.

Figure 7:
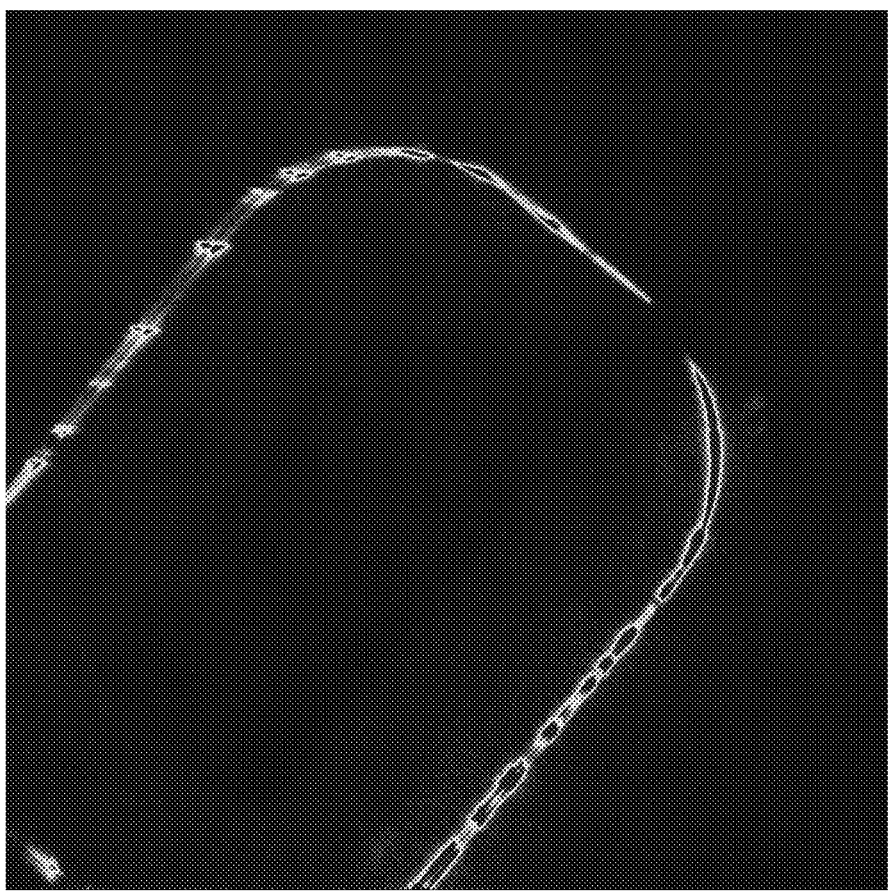
FIG. 7 is an image of the electroluminescence (EL) signal at edge of a GaN diode.

In FIG. 7 is shown an image of an EL signal at the edge of a GaN diode. The EL is due to electron-hole pairs created by impact ionization that subsequently undergo radiative recombination. This capability can distinguish between defect-related breakdown vs breakdown due to design or processing errors. For example, if the JTE dose is too low, breakdown and thus EL will occur at the outer edge of the termination.

Another reliability concern for a device operating at high temperature (>175° C.) and high current density (>1 kA/cm$^2$) is the stability of the Ohmic contacts. The degradation of the contacts can cause an increase in parasitic resistance that diminishes device performance. Thus, reliability testing of fabricated GaN diodes under forward-bias, high-current-density and high-temperature stress conditions (i.e. HTOL conditions) can be conducted.

Numerical Modeling

Modeling can be used to reduce the number of fab cycles, and hence the time and cost, required to fabricate devices that exhibit the desired performance. A tool can be developed to enable a complete evaluation of a GaN power electronic device starting from its design and layout, all the way through its performance in a test circuit, without running wafers through the fab. Various large-signal parameters of the diodes can be extracted, and the model can generate a datasheet containing all relevant information for the device, including energy consumed per switching cycle, switching losses, turn-off and turn-on times, reverse recovery times, etc.

EMP Arrestor Demonstration

To verify the usefulness of the fabricated high-voltage GaN PN diodes for the EMP arrestor application, the diodes can be demonstrated in a simulated EMP environment. Simultaneously, the temporal response of the avalanche breakdown process can be characterized. A modified version of a method recently developed to analyze semiconductor device response times to 1 kV voltage pulses, that has a resolution of 130 ps, can be used to study the timescale response, as shown in FIG. 3. See D. L. Mauch et al., "Ultrafast Reverse Recovery Time Measurements for Wide-Bandgap Diodes," *IEEE Trans. Elec. Dev.* 32 (12), 9333 (2017). This method has demonstrated single-nanosecond conducting-to-blocking reverse recovery times ($t_{rr}$) of 1.2 kV vertical GaN PN diodes. The experimental setup can be modified to apply a 10-kV voltage and to monitor reverse breakdown as opposed to reverse-recovery. Further, the response of a fully-packaged 20 kV diode can be characterized by direct injection of a simulated EMP waveform using a similar pulse characterization setup. While a response time <10 ns is targeted for the pulse arrestor, the device must endure avalanche for a longer time that is consistent with an EMP-induced voltage pulse (few hundred ns). The device must be able to survive the energy generated during this time, which for a worst-case scenario of a 500-ns pulse can be roughly (20 kV)×(1 kA/cm$^2$)×(500 ns)=10 J/cm$^2$. Previous work has demonstrated that vertical GaN PN diodes can withstand $10^5$ pulses of ~1 J/cm$^2$ each, i.e. a total energy of $10^5$ J/cm$^2$. See O. Aktas and I. C. Kizilyalli, "Avalanche Capability of Vertical GaN p-n Junctions on Bulk GaN Substrates," *IEEE Elec. Dev. Lett.* 36 (9), 890 (2015).

High-Voltage GaN PN Diodes

Figure 8:
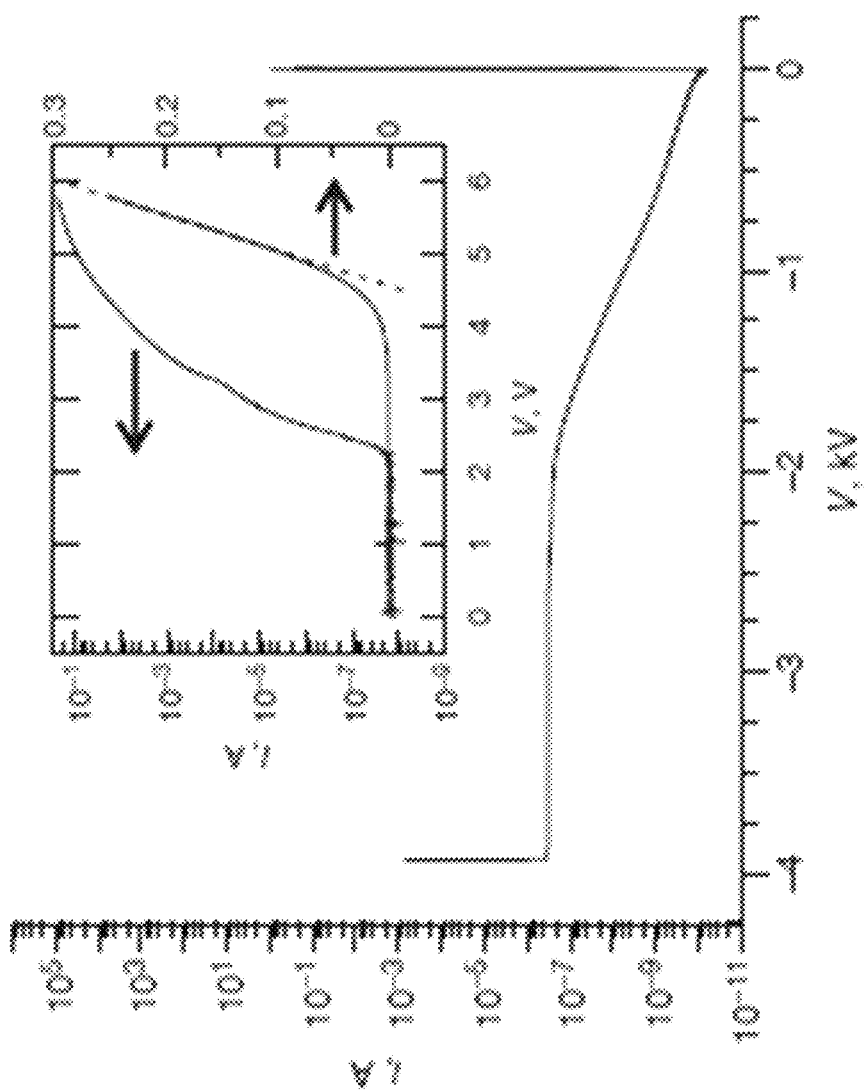
FIG. 8 is a graph of DC reverse-bias current-voltage data for a 3.9 kV vertical GaN PN diode. The inset shows the forward bias performance of this diode. See A. M. Armstrong et al., "High Voltage and High Current Density Vertical GaN Power Diodes," *Elec. Lett.* 52 (13), 1170 (2016).

The highest breakdown voltage achieved by the inventors and their colleagues in prior devices is >3.9 kV on a device using a 30 μm thick drift layer with a net donor density of $3\times10^{15}$ cm$^{-3}$. This prior device had a JTE edge termination design. The current-voltage characteristics for this device are shown in FIG. 8. See A. M. Armstrong et al., "High Voltage and High Current Density Vertical GaN Power Diodes," *Elec. Lett.* 52 (13), 1170 (2016). The specific on resistance of the device was <0.9 mΩ cm$^2$. An effective critical electric field of ~3.9 MV/cm was estimated for this device using measured electrical breakdown data. At the time of publication, this diode had the highest unipolar figure-of-merit (UFOM) for any reported GaN PN diode at ~18 GW/cm$^2$. However, recently researchers from Hosei University in Japan have surpassed this result, achieving ~20 GW/cm$^2$ using advanced edge-terminations. See H. Ohta et al., "5.0 kV Breakdown Voltage Vertical GaN pn Junction Devices," *Jap. J. Appl. Phys.* 57, 04FG09 (2018).

Additionally, existing data has demonstrated that vertical GaN PN diode reliability, as evaluated by HTRB testing, depends (among other factors) on the miscut angle and uniformity of the GaN substrate. See I. C. Kizilyalli et al., "Reliability Studies of Vertical GaN Devices Based on Bulk GaN Substrates," *Microelec. Rel.* 55, 1654 (2015). The impact of the substrate on the detailed microstructure of the epilayer impacts leakage and reliability of the diodes. Finally, avalanche testing of vertical GaN PN diodes, similar to what would be experienced by the diode when used as an EMP arrestor, has been conducted. See O. Aktas and I. C. Kizilyalli, "Avalanche Capability of Vertical GaN p-n Junctions on Bulk GaN Substrates," *IEEE Elec. Dev. Lett.* 36 (9), 890 (2015). Under such conditions, there is a very large power dissipation in the device for a brief time. The Kizai GaN PN diode undergoing avalanche breakdown. During avalanche breakdown of the GaN PN diode of Kizilyalli, 1.5 A reverse current was passed through the device while at 1500 V reverse bias, depositing approximately 12 mJ into the device during the pulse. IV testing of the diode after the breakdown indicated that the device was still operational, demonstrating its avalanche ruggedness.

The present invention has been described as a gallium nitride electromagnetic pulse arrestor. It will be understood that the above description is merely illustrative of the applications of the principles of the present invention, the scope of which is to be determined by the claims viewed in light of the specification. Other variants and modifications of the invention will be apparent to those of skill in the art.

We claim:

1. An electromagnetic pulse arrestor, comprising:
   a high-doped n-type gallium nitride substrate or contact layer;
   a low-doped n-type gallium nitride drift layer epitaxially grown on the gallium nitride substrate, wherein the thickness of the low-doped n-type gallium nitride drift layer is greater than 100 μm, wherein the low-doped n-type gallium nitride drift layer is grown by metal-organic chemical vapor deposition;
   a high-doped p-type gallium nitride layer epitaxially grown on the drift layer, thereby forming a p-n junction with the drift layer;
   an edge termination structure laterally surrounding the p-n junction on the drift layer;
   an ohmic cathode contact to the high-doped n-type gallium nitride substrate or contact layer;
   and an ohmic anode contact to the high-doped p-type gallium nitride layer.

2. The electromagnetic pulse arrestor of claim 1, wherein the substrate is grown by hydride vapor-phase epitaxy or ammonothermal bulk growth.

3. The electromagnetic pulse arrestor of claim 1, wherein the low-doped n-type gallium nitride drift layer has a donor density of less than $2 \times 10^{15}$ cm$^{-3}$.

4. The electromagnetic pulse arrestor of claim 3, wherein the donor density of less than $2 \times 10^{15}$ cm$^{-3}$ is achieved by growth under compensation doping conditions.

5. The electromagnetic pulse arrestor of claim 1, wherein the high-doped p-type gallium nitride layer has an acceptor density of greater than $10^{19}$ cm$^{-3}$.

6. The electromagnetic pulse arrestor of claim 1, wherein the electromagnetic pulse arrestor has an avalanche breakdown voltage of greater than 20 kV in reverse bias.

7. The electromagnetic pulse arrestor of claim 1, wherein the electromagnetic pulse arrestor has a response time of less than 10 ns.

8. The electromagnetic pulse arrestor of claim 1, wherein the electromagnetic pulse arrestor is electrically connected in parallel with a grid equipment to be protected, such that the voltage experienced by the grid equipment during an electromagnetic pulse event is clamped at an avalanche breakdown voltage of the electromagnetic pulse arrestor.

* * * * *